United States Patent
Weng et al.

(10) Patent No.: US 8,023,705 B2
(45) Date of Patent: Sep. 20, 2011

(54) METHOD FOR RECONSTRUCTING IMAGE FROM ECHO PLANAR IMAGING SEQUENCE

(75) Inventors: De He Weng, Shenzhen (CN); Wei Jun Zhang, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 1026 days.

(21) Appl. No.: 11/863,509

(22) Filed: Sep. 28, 2007

(65) Prior Publication Data

US 2008/0089570 A1    Apr. 17, 2008

(30) Foreign Application Priority Data

Sep. 29, 2006    (CN) .......................... 2006 1 0113514

(51) Int. Cl.
*G06K 9/00* (2006.01)
(52) U.S. Cl. ..................................................... 382/128
(58) Field of Classification Search .................. 382/128, 382/130, 131; 600/407, 437, 440, 443, 449; 430/39; 378/4, 21, 25, 62
See application file for complete search history.

(56) References Cited

U.S. PATENT DOCUMENTS

| | | | | |
|---|---|---|---|---|
| 4,940,941 A | * | 7/1990 | Rzedzian | 324/312 |
| 4,993,075 A | * | 2/1991 | Sekihara et al. | 382/131 |
| 5,672,969 A | * | 9/1997 | Zhou et al. | 324/309 |
| 6,249,595 B1 | * | 6/2001 | Foxall et al. | 382/128 |
| 6,697,507 B1 | * | 2/2004 | Chapman | 382/131 |
| 2002/0000805 A1 | * | 1/2002 | Kuhara | 324/306 |

* cited by examiner

*Primary Examiner* — Jason M Repko
*Assistant Examiner* — Shervin Nakhjavan
(74) *Attorney, Agent, or Firm* — Schiff Hardin LLP

(57) ABSTRACT

In a method for reconstructing an image from an echo planar imaging sequence, the echo planar imaging sequence is used to obtain multi-line k-space data from a subject and the multi-line k-space data are divided into odd line data and even line data. Fourier transform is performed on the odd line data and on the even line data separately to obtain corresponding amplitude images. The amplitude images obtained is this manner are added to produce the final image. The method effectively eliminates N/2 artifacts by over-sampling in the phase direction. By image reconstruction being carried out separately on the odd line data and even line data of k-space data and then integrating the images, the method effectively avoids the problem of the image signal loss caused by the mutual cancellation of the odd line data and even line data.

3 Claims, 2 Drawing Sheets

METHOD FOR RECONSTRUCTING IMAGE FROM ECHO PLANAR IMAGING SEQUENCE

BACKGROUND OF THE INVENTION

1. Field of the Invention

The present invention relates to a magnetic resonance imaging method, and more particularly to a method for reconstructing an image from an echo planar imaging (EPI) sequence.

2. Description of the Prior Art

An EPI imaging sequence is a fast magnetic resonance imaging sequence which only needs singe-shot pulses or multi-shot pulses to obtain a sequence of complete images. It generates a series of gradient echoes by means of alternating changes of the gradient of a magnetic field, and an image of the excited plane is obtained by performing Fourier transformation to the acquired k-space data.

In a conventional EPI sequence, the phase encoding gradient and the frequency encoding gradient of the sequence are illustrated with reference numbers 1 and 3 respectively in FIG. 1. Due to imperfections in the hardware system, such as eddy currents, delay in data acquisition, the nonuniformity of the basic magnetic field, Maxell effects, inconsistent magnetization, etc., the readout data under positive and negative frequency encoding gradients are not completely consistent. For example, there are cases such as the echo centers are inconsistent, the spacing between each line of the k-space is not equal, etc. Due to the mismatch of time or the phase differences between the odd and even echoes in an echo sequence, a low intensity overlapping image appears on a normal image after its reconstruction at a position half way offsetting an actual field of view (FOV), that is, the appearance of N/2 artifacts (also referred to as Nyqusit artifacts). In addition, due to the non-uniformity of the main magnetic field and the inconsistent magnetization, the odd and even echo signals cancel each other, leading to a signal loss in the reconstructed image.

In order to eliminate N/2 artifacts as much as possible, some correction methods, such as phase correction methods, unipolar readout gradient methods, post-processing methods, over-sampling methods, etc., are utilized in the prior art.

One of the phase correction methods is a one-dimensional phase correction method, in which before reading the image data, several echo signals without phase encoding, such as the echo signal 4 in FIG. 1, are sampled; and according to the first and the second echo signals, the position difference between their echo centers is calculated and used as a correction value to correct the collected image data, that is, to correct the echo center differences between all the odd and even lines. Since not all the echo center deviations between the odd and even lines are equal to the calculated correction value, this method can remove N/2 artifacts to a certain level and reduces the image signal loss, but it cannot eliminate all the artifacts. Furthermore, this method is unstable, especially in a medium or low permanent-magnet field. Due to the poor uniformity of the magnetic field, the relatively large gradient eddy currents and the relatively low magnetic field, the N/2 artifacts are still prominent after the phase correction, and sometimes they become even more prominent than those without the phase correction.

Another one of the phase correction methods is a two-dimensional phase correction method, in which, likewise before reading the image data, a series of echo signals with phase encoding are sampled and are then used to correct the actual image data. Although this method can solve the problem of the N/2 artifacts effectively, the rapidity of the EPI sequence is lost because of the prolonged time for sequence acquisition.

In the unipolar readout gradient method, data are collected only during the activation of a readout gradient of one polarity, so the method can avoid the problem of N/2 artifacts completely, but it cannot correct the image deformation and it wastes the scanning time. Furthermore, due to the extended echo intervals, it leads to a decrease of the equivalent sampling bandwidth in the phase encoding direction, and an increase of image deformation and distortion.

Post-processing methods can reduce the N/2 artifacts to a certain degree, but cannot avoid this problem completely. Moreover, because such methods ensue in the post-processing of already-acquired data, an image processed and corrected by this method suffers a significant loss in image information and also its reconstruction time is quite long.

An over-sampling method is disclosed in U.S. Pat. No. 6,320,238 that performs over-sampling in the phase encoding direction of an EPI imaging sequence to enlarge the FOV in the phase direction, so as to correspondingly shift the N/2 artifacts out of the displayed FOV, and to achieve the goal of eliminating the N/2 artifacts. Compared with above-mentioned methods, the over-sampling method is the simplest and the most effective, but this method cannot overcome the problem of image signal loss.

SUMMARY OF THE INVENTION

An object of the present invention is to provide a method for reconstructing an image from an echo planar imaging sequence, so as to eliminate N/2 artifacts and overcome the problem of image signal loss.

The above object is achieved in accordance with the present invention by a method for reconstructing an image from an echo planar imaging sequence wherein an echo planar imaging sequence is used to obtain corresponding multi-line k-space data; the multi-line k-space data are divided into odd line data and even line data, Fourier transform is performed on the odd line data and the even line data separately to obtain respective amplitude images and the obtained amplitude images are added to obtain a final image.

Assuming that the size of an imaged object in the phase encoding direction is Y, the size of the field of view thereof in the phase encoding direction is FOVy. When FOVy$\geq$2*Y, it is possible not to use the over-sampling in the phase encoding direction, but when FOVy<2*Y, the over-sampling has to be used, with the percentage of the over-sampling being greater than or equal to (2*Y−FOVy)*100%/FOVy. By the use of the such over-sampling, the field of view in the phase direction is made to be greater than or equal to twice the size of the imaged object in the phase encoding direction. The echo planar imaging sequence is a single-shot echo planar imaging sequence.

The present invention effectively eliminates the N/2 artifacts by over-sampling in the phase direction; and by the image reconstruction being carried out separately for the odd line data and even line data of the k-space data and then integrating the images, it effectively avoids the problem of image signal loss caused by the mutual cancellation of the odd line data and even line data.

DESCRIPTION OF THE PREFERRED EMBODIMENTS

Figure 1:
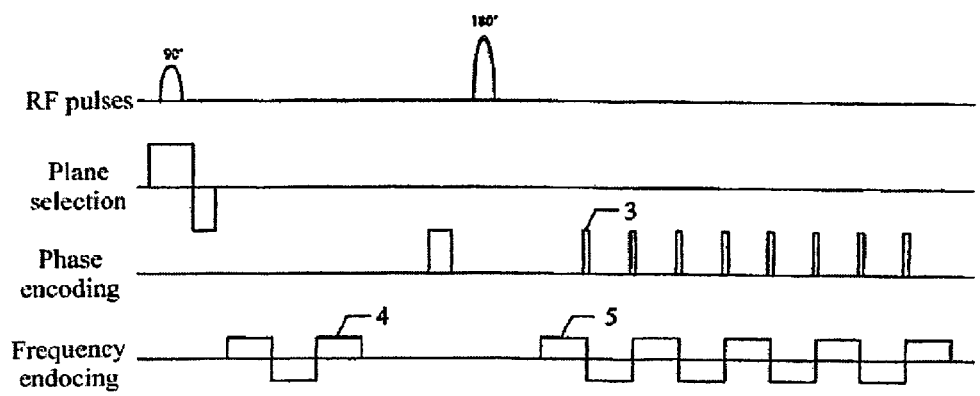
FIG. 1 shows a sequence diagram of a conventional EPI imaging sequence.

The method for reconstructing an image from an echo planar imaging sequence according to the present invention adopts a common EPI imaging sequence, such as the conventional EPI imaging sequence shown in FIG. 1, to collect echoes for filling k-space, so as to obtain the corresponding k-space data. The conventional EPI imaging sequence in this embodiment is a single-shot EPI imaging sequence or a multi-shot EPI imaging sequence, and preferably, short phase encoding is adopted for the single-shot or multi-shot.

In the conventional EPI imaging sequence, when 90° radio frequency excitation pulses are applied, an appropriate slice selecting gradient is chosen, then 180° radio frequency pulses are applied and echoes are received after a period of TE (echo time, the time between an exciting pulse of an imaging sequence and the echo generated by it as a magnetic resonance signal). When the echoes are received, the frequency encoding gradient (that is, the readout gradient) is applied thereto, and then the sampling results of the echo signals are entered into a certain line of k-space.

In the EPI sequence used in this embodiment, after one radio frequency excitation, k-space is filled continuously by applying the frequency-encoding gradient, with the frequency-encoding gradient being applied with alternating polarity, so as to generate a number of echoes which are collected to fill up all the lines of k-space. Short phase encoding is adopted for this EPI imaging sequence, and when the frequency-encoding gradient is zero, the phase encoding gradient is applied temporally so that the (sampling) filling trajectory of k-space is performed in an odd/even manner.

Figure 2:
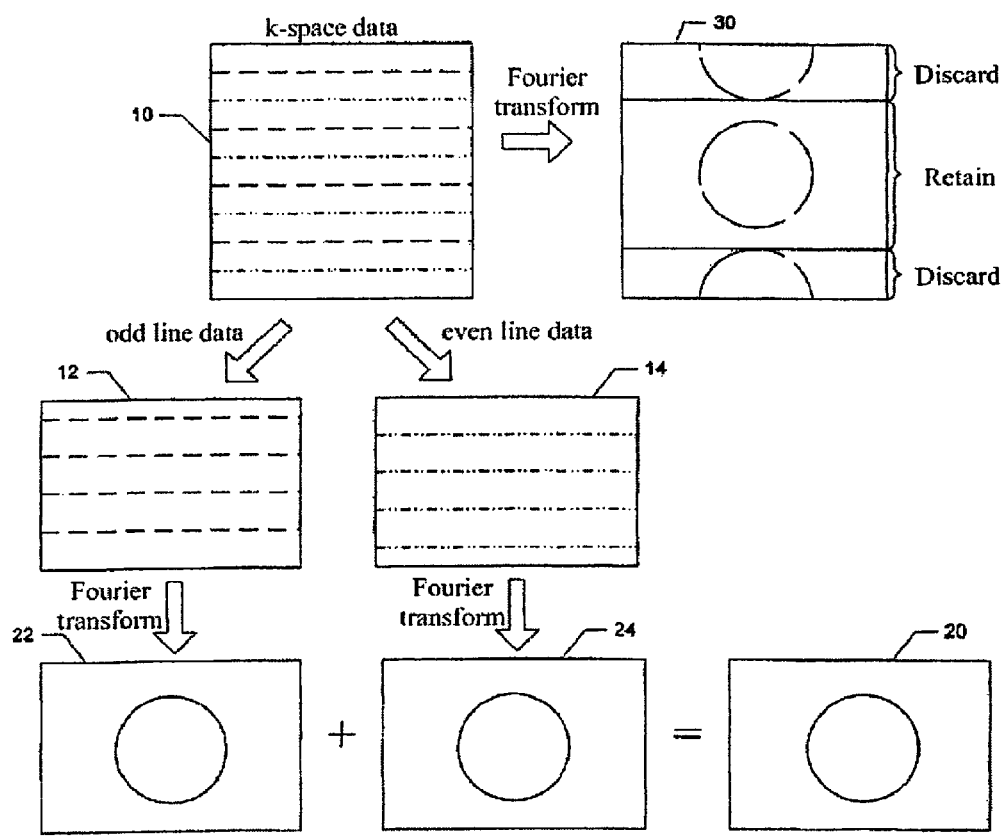
FIG. 2 is a schematic diagram of the image reconstruction method for the echo planar imaging sequence according to the present invention.

Referring to FIG. 2, when adopting this EPI imaging sequence in the method for reconstructing an image from an echo planar imaging sequence according to the present invention, it is assumed that the size of the imaged object in the phase encoding direction is Y, the size of the field of view in the phase encoding direction is FOVy. When FOVy≧2*Y, it is possible not to use over-sampling in the phase encoding direction, but when FOVy≦2*Y, the over-sampling in the phase encoding direction has to be used with the percentage of the over-sampling being greater than or equal to (2*Y−FOVy)*100%/FOVy. By means of this over-sampling, the FOV of the image 30 obtained after Fourier transform of the data 10 of k-space is enlarged and is made to be greater than or equal to twice the size of the imaged object in the phase encoding direction, so as to ensure that the N/2 artifacts are shifted entirely out of the image of the imaged object. The part that is not needed (namely, the N/2 artifacts) is discarded when the image is displayed.

Even through the N/2 artifacts are removed effectively from the obtained image by the above-described processing, when Fourier transform is performed on k-space data 10, it is possible that the odd and even echo signals (namely, the odd line data and the even line data after k-space has been filled) may cancel each other, thereby leading to signal loss in the obtained image.

In order to solve this problem, in the present invention k-space data 10 are first divided into odd line data 12 and even line data 14, and a Fourier transform is performed on the odd line data 12 and on the even line data 14 separately, to obtain corresponding amplitude images 22 and 24. The amplitude images 22 and 24 obtained in this manner are added to get the final image.

In the present invention, since the Fourier transform is performed separately on the odd line data 12 and on the even line data 14 so as to reconstruct the amplitude images, 22 and 24 the signal loss caused by the Fourier transform on said k-space data 10 is avoided as a whole for reconstructing the image, and at the same time it ensures a good signal-to-noise ratio of the final image.

Figure 3:
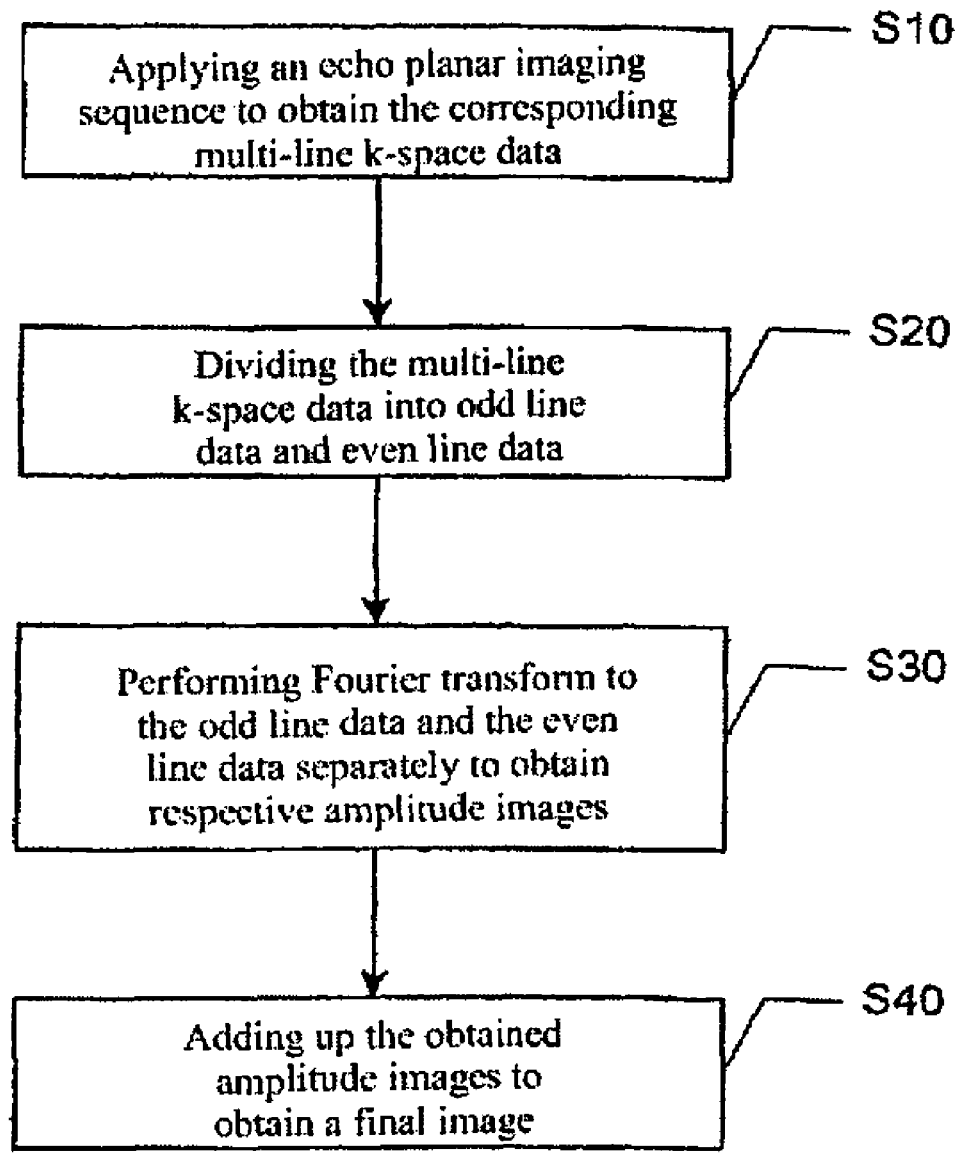
FIG. 3 is a flowchart of the image reconstruction method for the echo planar imaging sequence according to the present invention.

The flowchart of the method for reconstructing an image from an echo planar imaging sequence according to the present invention is shown in FIG. 3 as follows:

Step S10: Applying an echo planar imaging sequence to obtain the corresponding multi-line k-space data, wherein over-sampling is performed in the phase encoding direction when the field of view FOVy in the phase encoding direction is less than twice the size Y of the imaged object in the phase encoding direction, with the percentage of the over-sampling being greater than or equal to (2*Y−FOVy)*100%/FOVy.

Step S20: Dividing the multi-line k-space data into odd line data and even line data.

Step S30: Performing Fourier transform on the odd line data and on the even line data separately to obtain respective amplitude images.

Step S40: Adding the obtained amplitude images to obtain the final image.

Although modification and changes may be suggested by those skilled in the art, it is the intention of the inventor to embody within the patent warranted hereon all changes and modifications as reasonably and properly come within the scope of his contribution to the art.

We claim as our invention:

1. A method for reconstructing an image from an echo planar imaging sequence comprising the steps of:
    applying an echo planar imaging sequence to a subject to obtain multi-line k-space data from the subject;
    when a field of view FOVy in a phase encoding direction of said echo planar imaging sequence is less than twice a size Y of an imaged object of the subject in the phase encoding direction, over-sampling k-space in the phase encoding direction, with a percentage of said over-sampling being greater than or equal to (2*Y−FOVy)*100%/FOVy;
    dividing said multi-line k-space data into odd line data and even line data;
    performing Fourier transform on said odd line data and on said even line data separately to obtain respective amplitude images; and
    adding the obtained amplitude images to obtain a final image.

2. The method for reconstructing an image from an echo planar imaging sequence according to claim 1, comprising applying a single-shot echo planar imaging sequence as said echo planar imaging sequence.

3. The method for reconstructing an image from an echo planar imaging sequence according to claim 1, comprising applying a multi-shot echo planar imaging sequence as said echo planar imaging sequence.

* * * * *